United States Patent [19]

Frielink

[11] Patent Number: 4,926,173
[45] Date of Patent: May 15, 1990

[54] DATA ENTRY KEYBOARD APPARATUS

[75] Inventor: Franciscus J. Frielink, Nieuwegein, Netherlands

[73] Assignee: NCR Corporation, Dayton, Ohio

[21] Appl. No.: 331,767

[22] Filed: Apr. 3, 1989

[30] Foreign Application Priority Data

Nov. 10, 1988 [GB] United Kingdom ................ 8826430

[51] Int. Cl.[5] ..................... H03K 19/00; H03M 11/00
[52] U.S. Cl. ...................................... 341/22; 307/411; 341/26; 380/52
[58] Field of Search ........................ 341/26, 24, 33, 25, 341/22; 307/542.1, 570, 571, 572, 573, 411, 446, 448, 471, 481; 340/709, 711, 712, 825.31, 825.34; 178/176; 400/472, 477, 479, 479.1; 379/368; 380/9, 21, 44, 46, 52, 45, 49

[56] References Cited

U.S. PATENT DOCUMENTS

| | | | |
|---|---|---|---|
| 4,479,112 | 10/1984 | Hirsch | 380/52 |
| 4,549,094 | 10/1985 | Floyd | 341/24 |
| 4,617,554 | 10/1986 | Krause et al. | 341/26 |

FOREIGN PATENT DOCUMENTS

| | | |
|---|---|---|
| 0089646 | 3/1983 | European Pat. Off. . |
| 0094130 | 5/1983 | European Pat. Off. . |

*Primary Examiner*—Ulysses Weldon
*Attorney, Agent, or Firm*—Wilbert Hawk, Jr.; Albert L. Sessler, Jr.; Richard W. Lavin

[57] ABSTRACT

A data entry keyboard apparatus includes a key switch array (18) in a keyboard unit (12) connected via a cable (14) to a tamper-resistant module (28) which contains control circuitry (16). The control circuitry (16) includes a random pattern generator (30) which generates successive random patterns, causing the selection of a single column and a random pattern of rows, thereby effecting the simulation of key actuations. An EXCLUSIVE-OR gating network (56a–56d) is effective to distinguish a genuine key actuation from simulated key actuations. The invention prevents the ascertainment of actuated keys by unauthorized tapping connections applied to the keyboard unit (12) or the cable (14).

7 Claims, 10 Drawing Sheets

DATA ENTRY KEYBOARD APPARATUS

BACKGROUND OF THE INVENTION

1. Field of the Invention

This invention relates to a data entry keyboard apparatus of the kind including an array of key switches connected between row and column conductors, and associated control means connected to said row and column conductors for detecting the actuation of a key switch and providing an output signal representing an actuated key switch.

2. Description of the Prior Art

Data entry keyboard apparatuses of the kind specified are generally known and find application in various devices, for example, computer entry terminals, ATM's (Automated Teller Machines) and EFTPOS (Electronic Funds Transfer at Point of Sale) terminals.

Frequently, such known data entry keyboard apparatuses are utilized for the entry of information which should remain confidential to the person entering the information on the keyboard, for example, a customer PIN (Personal Identification Number) which may be used to identify the customer by a keyboard entry in an ATM or EFTPOS terminal.

However, the known apparatuses have the disadvantage that it is possible for an unauthorized person to attach electrical "tapping" connections to the keyboard conductors or to the electrical leads which connect the keyboard to the control circuitry, and by monitoring such tapping connections, the unauthorized person may ascertain confidential information subsequently entered into the keyboard.

SUMMARY OF THE INVENTION

This invention relates to data entry keyboard apparatuses of the kind specified, characterized in that the control means associated with the keyboard apparatuses includes: random pattern generating means adapted to generate successive random patterns of a first type and second type binary signals; a plurality of first port means coupled to said random pattern generating means and to respective ones of said row conductors; decoding means coupled to said random pattern generating means and to a plurality of second port means coupled respectively to said column conductors; and detection means coupled to said random pattern generating means and to said plurality of first port means, whereby, in operation, each generated random pattern operates said decoding means to cause said second port means to provide a first type binary signal to a selected one of said column conductors and a second type binary signal to the remaining ones of said column conductors, and operates said plurality of first port means, such that a row conductor associated with an actuated key switch in the selected column has a first type binary signal applied thereto, whereas the remaining row conductors have binary signals applied thereto corresponding to the random pattern operating the decoding means aid detection means being adapted to detect a first port means which has a second type binary signal applied thereto by the random pattern operating the decoding means and which is coupled to a row conductor having a first type binary signal thereon, thereby enabling the generation of said output signal representing the actuated key switch.

It will be appreciated that in a data entry keyboard apparatus according to the invention, the successive random patterns result in the generation of simulated key actuations, and render it extremely difficult, or effectively impossible, for an unauthorized person to distinguish, by using tapping connections, between a genuine key actuation and a simulated key actuation.

It is thus an object of the present invention to provide a keyboard apparatus of the kind specified which prevents unauthorized entry into the keyboard.

BRIEF DESCRIPTION OF THE DRAWINGS

Additional advantages and meritorious features of the present invention will be apparent from the following detailed description and appended claims when read in conjunction with the drawings, wherein like numerals identify corresponding elements.

FIGS. 1A–1D inclusive show a schematic diagram of a data keyboard apparatus according to a first embodiment of the invention;

FIG. 2, on the sheet containing FIG. 1C, is a diagram showing the manner in which FIGS. 1A–1D inclusive are arranged to form the first embodiment of the data entry keyboard apparatus;

FIGS. 3A–3F inclusive show a schematic diagram of a data entry keyboard entry apparatus according to a embodiment of the invention; and FIG. 4, on the sheet containing FIG. 3C, is a diagram showing the manner in which FIGS. 3A–3F inclusive are arranged to form the second embodiment of the data entry keyboard apparatus.

DESCRIPTION OF THE PREFERRED EMBODIMENT

Referring now to FIGS. 1A–1D inclusive, there is shown a keyboard apparatus 10 including a keyboard 12 (FIGs. 1B and 1D) connected by a cable 14 to control circuitry 16 (FIGS. 1A and 1C) which is adapted to provide a signal representing an actuated key in the keyboard 12.

In the preferred embodiment, the keyboard apparatus 10 is a customer identification module (CIM) which is utilized as part of a data entry unit (not shown) for use with an EFTPOS system or an ATM system. It should be understood that a customer identifies himself to the system by entering his PIN in the keyboard of the CIM. It is highly desirable that the customer PIN remains a secret known only to the customer since unauthorized use of a customer PIN could compromise the system.

In the present embodiment, the possibility of identifying the actuated keys by tapping the cable 14 or the row and column conductors within the keyboard 12, is substantially obviated.

The keyboard 12 (FIGS. 1B and 1D) includes a conventional key switch array 18 (FIG. 1D) of key switches K0–K15 inclusive arranged in rows and columns. Although sixteen key switches K0–K15 inclusive arranged in four rows R0–R3 and four columns C0–C3 are shown, it will be appreciated that in other applications a different number of key switches arranged in different numbers of rows and columns could be utilized. In the present embodiment, however, the key switches K0–K15 inclusive are connected between four row conductors 20a–20d inclusive and four column conductors 22a–22d inclusive. The row and column conductors 20a–20d inclusive and 22a–22d inclusive are connected to terminals 24a–24h inclusive of the keyboard 12.

The keyboard terminals 24a-24h inclusive are coupled to eight individual conductors 14a-14h inclusive, forming the cable 14. The other ends of the eight conductors 14a-14h inclusive are coupled to terminals 26a-26h inclusive of a tamper-resistant module 28 (FIGS. 1A-1D inclusive). A tamper-resistant module is a box-like device which is extremely difficult to penetrate in preventing the circuitry within the module to be sensed or interfered with. An example of a tamper-resistant module is a security module such as is disclosed in U.S. Pat. No. 4,593,384. The keyboard 12, cable 14 and tamper-resistant module 28 are all located within the CIM containing the keyboard apparatus 10.

The control circuitry 16 (FIGS. 1A and 1C) located within the tamper-resistant module 28 includes a 6-bit random pattern generator 30, a column decoder 32, a latch 34 and a timing and control circuit 36.

The random pattern generator 30 has six output lines 40, 42, 44, 46, 48 and 50 and is effective to generate, at a rate of approximately 1000 patterns per second, sequences of random binary bit patterns on the output lines 40-50 inclusive, such that in a complete cycle of operation of the random pattern generator 30, all possible 6-bit binary patterns are generated in a random order. The random patterns are generated in response to clock signals applied over an input line 52 (FIG. 1A) from a clock generator (not shown) included in the timing and control circuit 36.

Figure 1A:
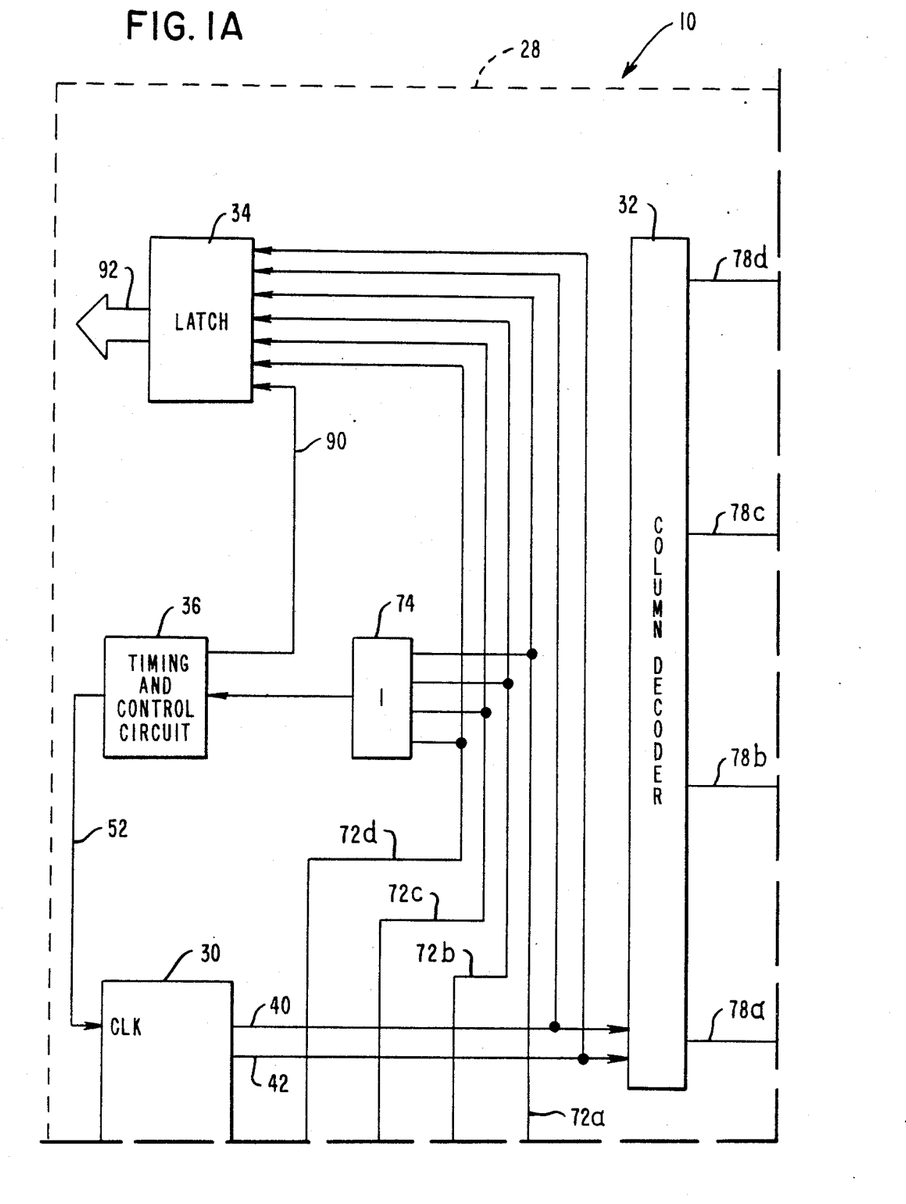

The output lines 40 and 42 of the random pattern generator 30, are connected to the column decoder 32 (FIG. 1A) and to the latch 34. The output lines 44, 46, 48, 50 are connected to respective row port circuits 54a-54d inclusive (FIG. 1D) and to first inputs of respective EXCLUSIVE-OR gates 56a-56d inclusive (FIG. 1C).

The row port circuit 54a (FIG. 1D) includes an inverter 60a having an input connected to the line 44 (FIG. 1C) over line 71a and an output connected to the gate electrode of an n-channel FET (field effect transistor) 62a having its source electrode connected to ground and its drain electrode connected to a line 64a which is also connected to the terminal 26a of the tamper-resistant module 28 and to one terminal of a resistor 66a, the other terminal of which is connected to a +5 V power supply. The line 64a is further connected to the input of a buffer circuit 68a, the output of which is connected over a line 70a to a second input of the EXCLUSIVE-OR gate 56a (FIG. 1C). The row port circuits 54b-54d inclusive are of identical construction to the row port circuit 54a, and have correspondingly referenced components included therein. Output lines 70b-70d inclusive and input lines 71b-71d inclusive of the row port circuits 54b-54d inclusive (FIG. 1B) are connected to respective second inputs of the EXCLUSIVE-OR gates 56b-56d inclusive. Output lines 72a-72d inclusive of the EXCLUSIVE-OR gates 56a-56d inclusive are connected to inputs of an OR gate 74 and to inputs of the latch 34 (FIG. 1A).

Figure 1B:
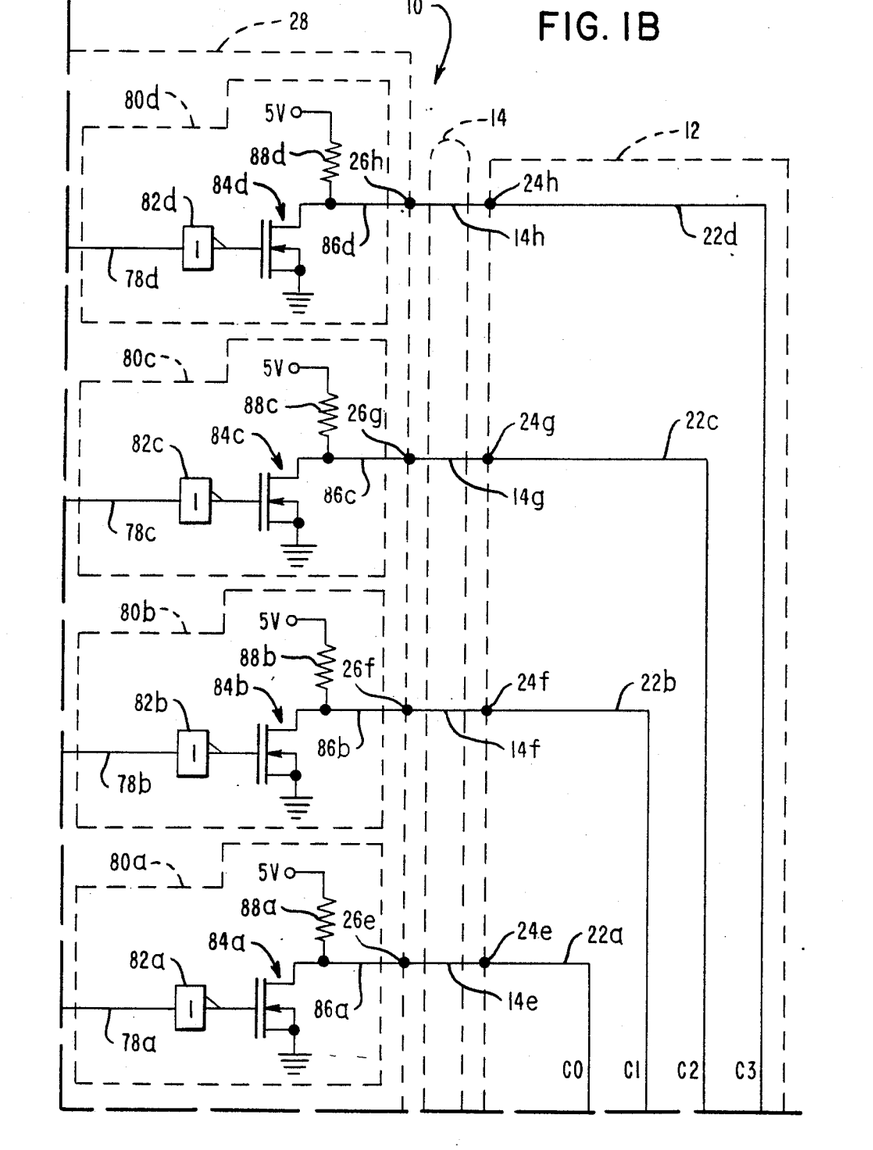
Figures 1C, 2:
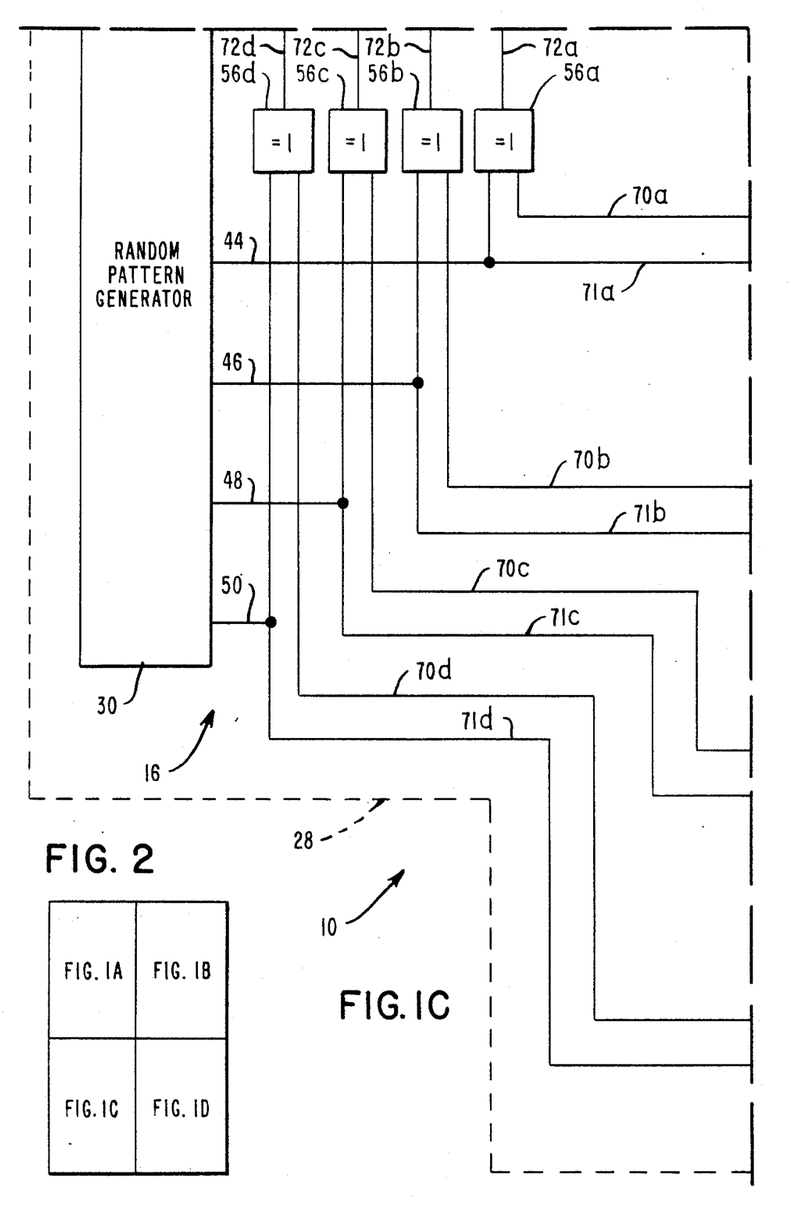
Figure 1D:
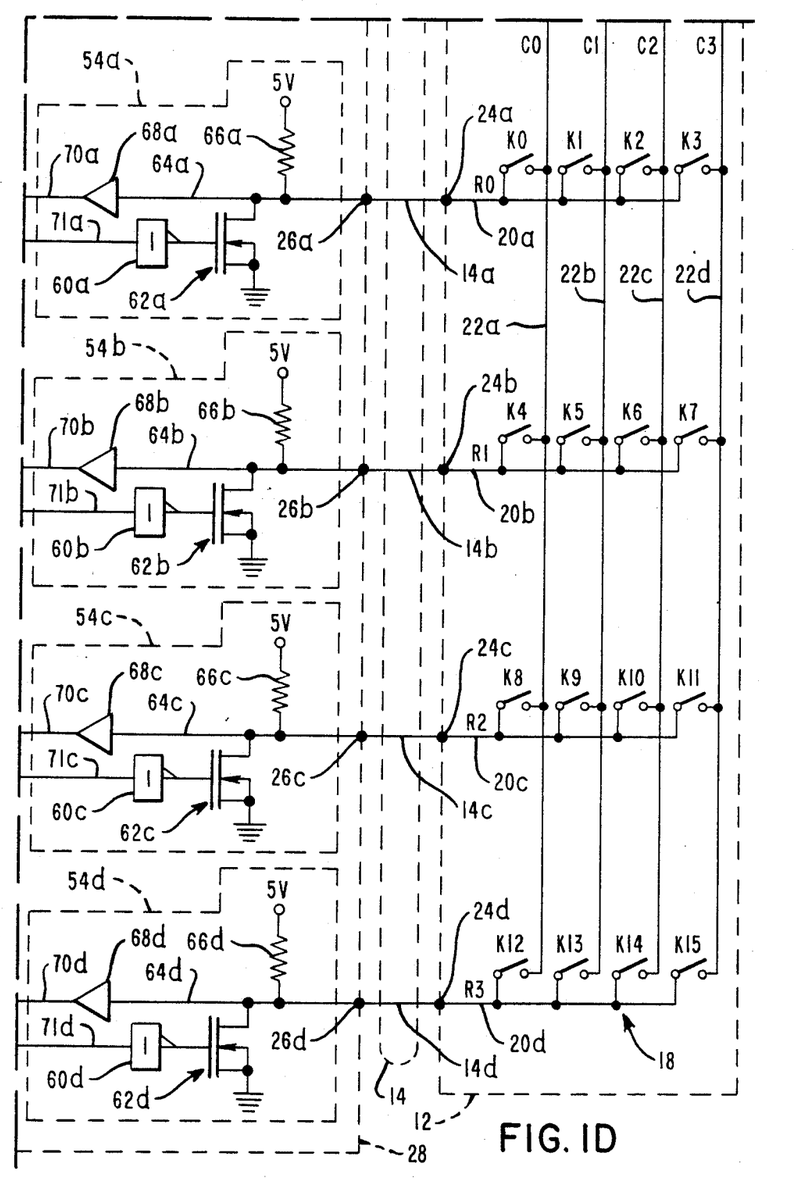

The column decoder 32 (FIG. 1A) has four output lines 78a-78d inclusive which are connected to respective column port circuits 80a-80d inclusive (FIG. 1B). The column port circuit 80a includes an inverter 82a having an input connected to the line 78a and an output connected to the gate electrode of an n-channel FET 84a. The source electrode of the FET 84a is connected to ground and the drain electrode is connected to a line 86a which is connected to one terminal of a resistor 88a, the other terminal of which is connected to the +5 V power supply. The line 86a is further connected to the terminal 26e of the tamper-resistant module 28. The remaining column port circuits 80b, 80c and 80d are of identical construction to the column port circuit 80a, and have correspondingly referenced components included therein.

The latch 34 (FIG. 1A) has, in addition to the inputs connected to the lines 40, 42 and 72a-72d inclusive, a further input connected via a line 90 to an output of the timing and control circuit 36. The latch 34 also has an output bus 92 on which is provided a signal representing an actuated key in the keyboard 12.

The operation of the keyboard apparatus 10 will now be described. It will be assumed by way of example that the keyboard key switch K8 (FIG. 1D), located in row R2 and column C0 is actuated (closed). As mentioned above, the random pattern generator 30 generates successive binary bit patterns. Assume by way of example, that the bit pattern 000110 is generated on lines 40, 42, 44, 46, 48 and 50, respectively. It should be understood that binary "0" corresponds to a low logic level (0 V in the present embodiment) and binary "1" corresponds to a high voltage level (+5 V in the present embodiment). The binary bits 00 applied over the lines 40 and 42 to the column decoder 32 cause a low level signal to be applied to the output line 78a and high level signals to be applied to the output lines 78b to 78d inclusive, thereby rendering the transistor 84a (FIG. 1B) conducting and the transistors 84b-84d inclusive non-conducting. This causes a low level signal to be applied to the column conductor 22a and high level signals to be applied to the column conductors 22b-22d inclusive. Thus, the column C0 is selected when the random pattern generator 30 generates the bit pair 00 on its output lines 40 and 42. Similarly, of course, the generation of the 01, 10 and 11 bit pairs result in the selection of the columns C1, C2 and C3, respectively.

With the assumed bit pattern, binary signals corresponding to a binary pattern 0110 are applied to the output lines 44, 46, 48 and 50, respectively, such signals rendering transistors 62a and 62d conducting and transistors 62b and 62c non-conducting. Thus, low level signals are applied to row conductors 20a and 20d of rows R0 and R3. With regard to row R2, although the transistor 62c is non-conducting, the presence of the actuated key switch K8 connects the row conductor 20c to the column conductor 22a and, since the transistor 84a is conducting, causes a low level signal to be applied to the row conductor 20c.

Thus, it will be appreciated that the unauthorized tapping of the cable 14 or the row and column conductors 20a-20d inclusive and 22a-22d inclusive will result in the detection of three key switches, namely key switches K0, K8 and K12 as being "actuated", including the genuinely actuated key switch K8 and two simulated actuated key switches K0 and K12. In other words, the actuation of the key switch K8 is "hidden" by the interposition of the simulated actuated key switches K0 and K12. The operation of the apparatus in response to different random patterns generated by the random pattern generator 30 will be apparent from the above-described specific pattern.

The identification of the genuinely actuated key switch K8 is detected using the EXCLUSIVE-OR gates 56a-56d inclusive (FIG. 1C) located within the tamper-resistant module 28. Thus, in the present example, the EXCLUSIVE-OR gates 56a-56d inclusive have binary signals 00, 11, 10 and 00 applied to their respective inputs, whereby only the gate 56c produces an output signal, on its output line 72c.

The signal on the output line 72c is applied via the OR gate 74 (FIG. 1A) to the timing and control circuit 36, which responds by supplying a latch control signal over the line 90 to the latch 34 thereby latching the signals on the lines 40, 42 and 72a–72d inclusive into the latch 34. Thus, the binary pattern 000010 is latched, the first two bits identifying the column C0 and the last four bits identifying the row R2. Thus, data corresponding to the genuinely actuated key switch K8 in row R2 and column C0 is latched into the latch 34 and available on the latch output bus 92. It will be appreciated that since the control circuitry 16, including the EXCLUSIVE-OR gates 56a–56d inclusive, is enclosed within the tamper-resistant module 28, the operating condition of the gates 56a–56d inclusive is protected from unauthorized detection.

With the above in mind, it will be appreciated that a very high degree of protection against unauthorized tapping of the keyboard 12 and associated cable 14 is achieved. Since the random pattern generator 30 generates random patterns at a high rate, such as 1000 patterns per second, a genuine key entry is effectively "hidden" since the very high proportion of simulated key entries renders the ascertainment of a genuine key entry extremely difficult, and indeed substantially impossible for persons of limited technical knowledge, such as shop personnel, sales clerks or the like. It has been found that if random patterns are generated at the aforementioned rate of 1000 patterns per second, then key actuations, including both genuine and simulated key actuations, are generated at the rate of approximately 2000 per second.

In connection with the above-described embodiment, it will be appreciated that the row and column port circuits 54a–54d inclusive (FIG. 1D) and 80a–80d inclusive (FIG. 1B) are constructed using open-collector type outputs with pull-up resistors 66a–66d inclusive and 88a–88d inclusive. The minimum pull-up resistor value should be approximately 50 Kohm to prevent current and voltage drop levels which might be detectable. The higher the value of the pull-up resistors, the lower the current and hence the more difficult is the detection of currents and voltage drops caused by the difference between a genuine key actuation and a simulated key actuation. Thus, for a 50 Kohm pull-up resistor, the current which flows for a genuine key actuation is 50 V/50 Kohm = 100 microamps, whereas with a simulated key actuation, a zero current flows. Similarly, the voltage difference between a simulated and a genuine key actuation is less than about 10 millivolts, depending on the parameters of the field effect transistors. By the use of sophisticated techniques, it could be possible for an unauthorized person to distinguish genuine and simulated key actuations on the basis of such voltage and/or current differences. A second embodiment of the invention, which will now be described, substantially prevents this possibility.

Figure 3A:
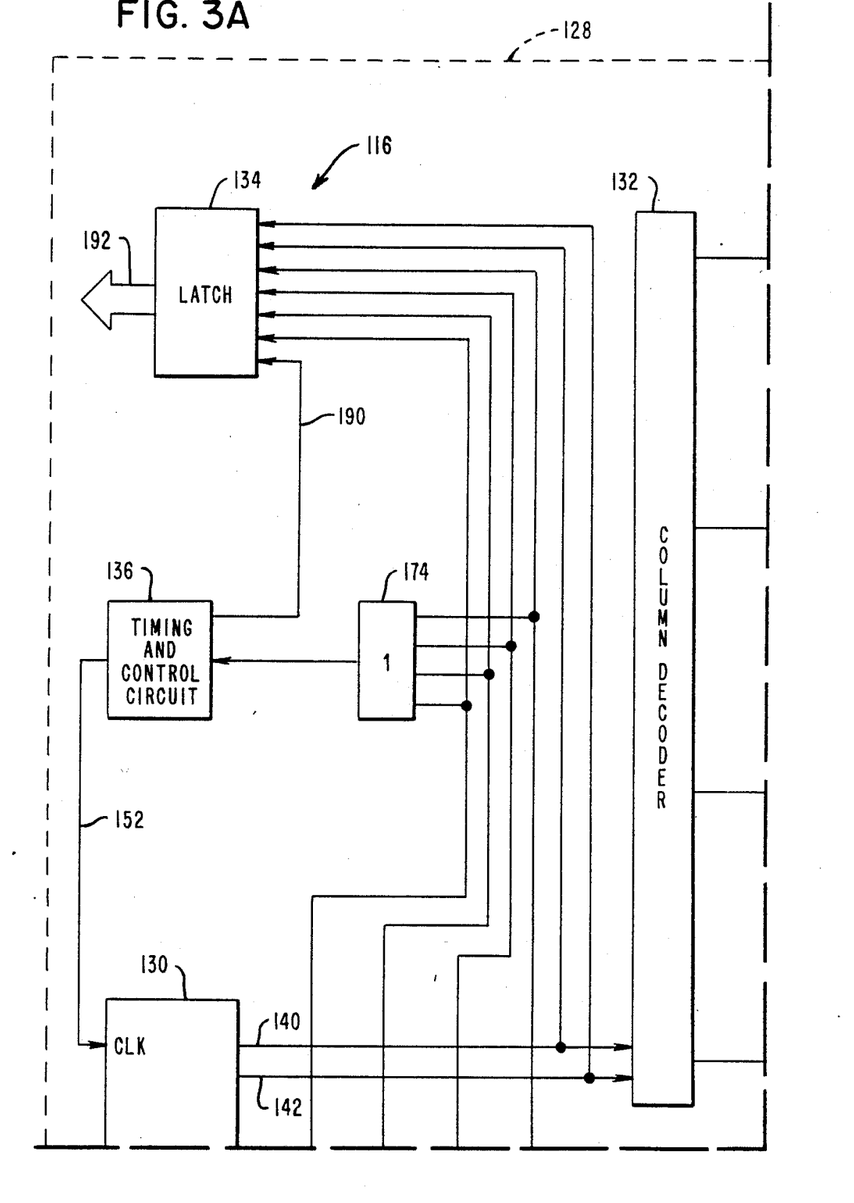
Figure 3B:
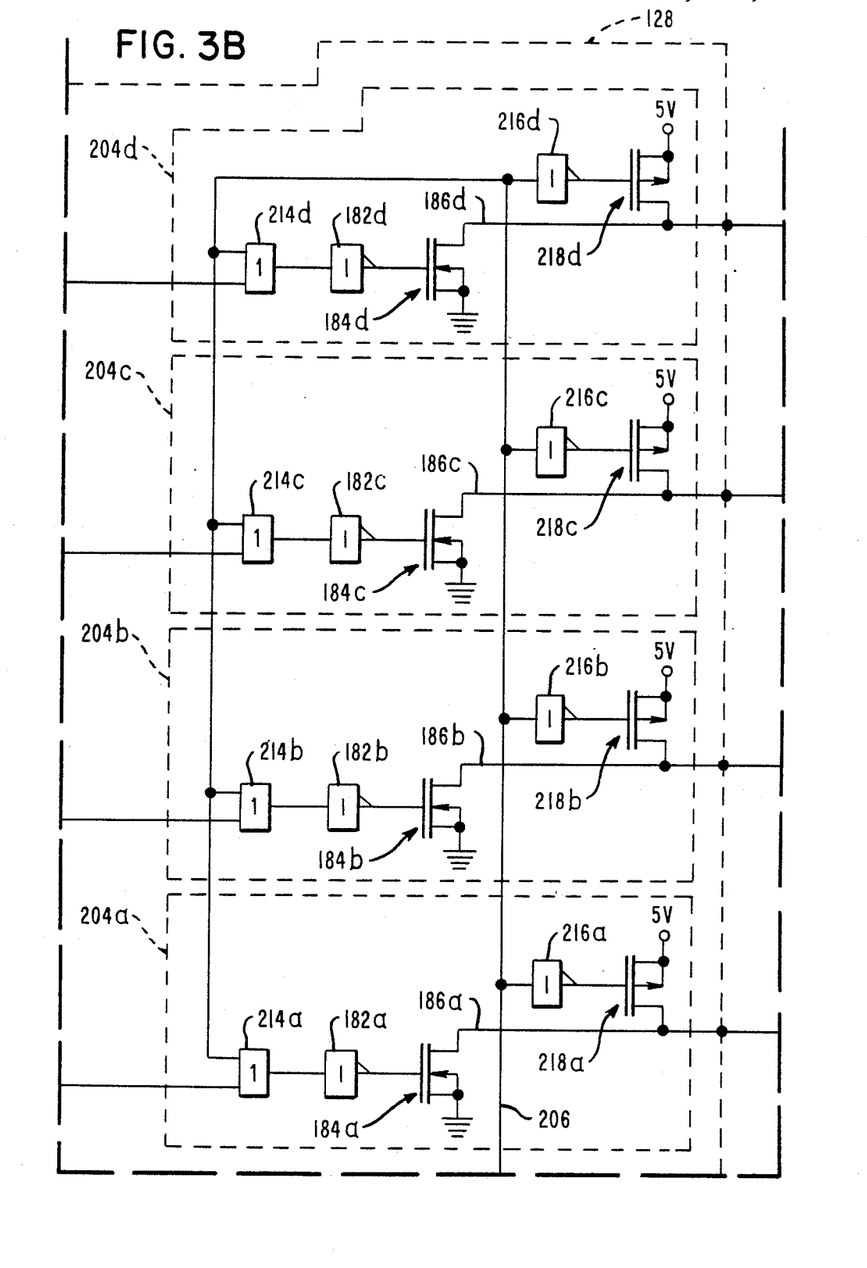

In the second embodiment of the invention, which will be described with references to FIGS. 3A–3F inclusive, the row and column port circuits 54a–54d inclusive (FIG. 1D) and 80a–80d inclusive (FIG. 1B) are modified by omitting the pull-up resistors and utilizing additional transistors and associated control circuitry. Some of the parts and components in FIGS. 3A–3F inclusive which correspond to parts and components in FIGS. 1A–1D inclusive have been given references differing by the value 100 from those of FIGS. 1A–1D inclusive. Thus, the keyboard 112 (FIGS. 3C and 3F), which includes a key switch array 118 (FIG. 3F) is connected by a cable 114 to control circuitry 116 located within a tamper-resistant module 128 (FIG. 3A and 3D). The second embodiment will best be understood by directing attention to features which differ from those of the first embodiment. In this regard, the row port circuits 202a–202d inclusive (FIG. 3E), differ to some extent from the row port circuits 54a–54d inclusive (FIGS. 1D), and the column port 204a–204d inclusive in FIG. 3B differ to some extent from the column port circuits 80a–80d inclusive in FIG. 1B.

Referring again to FIGS. 3A and 3D, the random pattern generator 130 has a strobe output connected to an output line 206. The strobe output supplies a short duration pulse, having a duration of approximately 50 nanoseconds, immediately prior to each new random pattern supplied by the random pattern generator 130.

The output line 206 is connected to OR gates 208a–208d inclusive (FIG. 3E) and inverters 210a–210d inclusive in the respective row port circuits 202a–202d inclusive, the outputs of the inverters 210a–210d inclusive being connected to the gate electrodes of respective p-channel transistors 212a–212d inclusive. The source electrodes of the transistors 212a–212d inclusive are connected to the +5 V voltage supply and the drain electrodes are connected to the lines 164a–164d inclusive, respectively.

The output line 206 is further connected to OR gates 214a–214d inclusive and inverters 216a–216d inclusive (FIG. 3B) in the respective column port circuits 204a–204d inclusive, the outputs of the inverters 216a–216d inclusive being connected to the gate electrodes of respective p-channel transistors 218a–218d inclusive. The source electrodes of the transistors 218a–218d inclusive are connected to the +5 V voltage supply and the drain electrodes are connected to the lines 186a–186d inclusive respectively.

Figures 3C, 4:
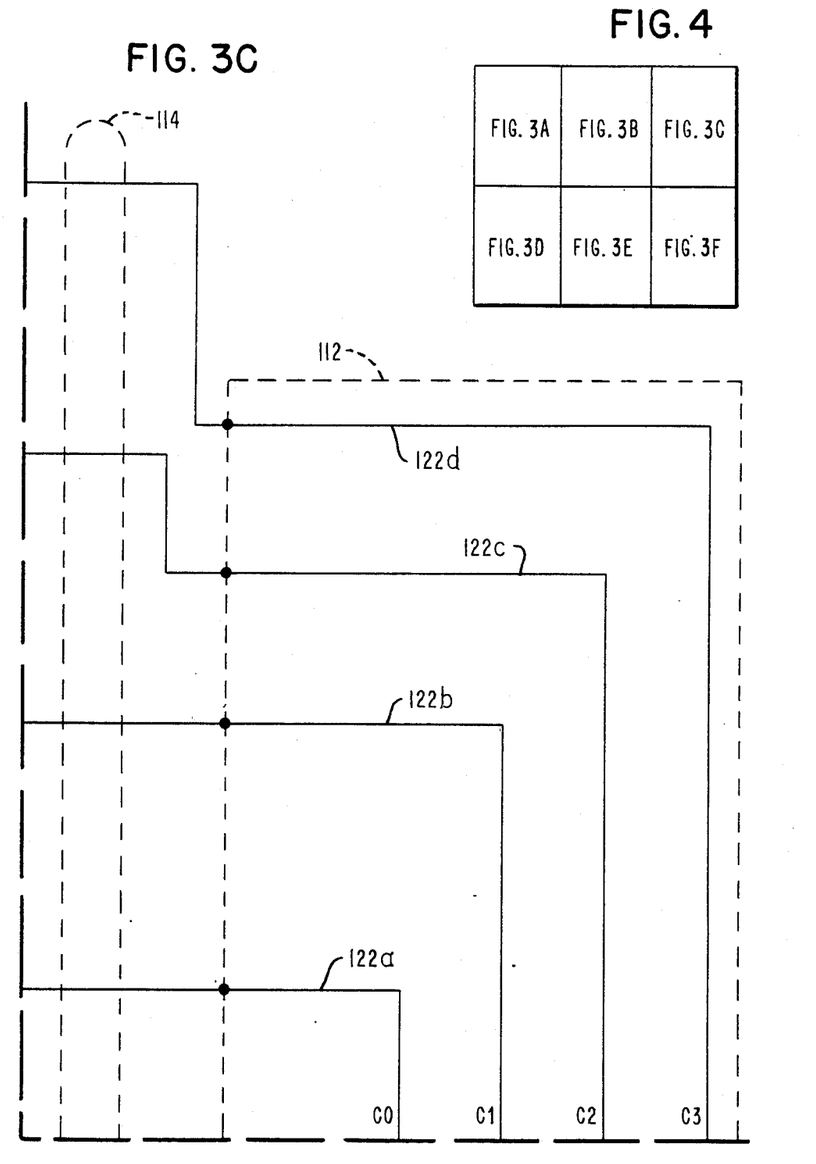
Figure 3D:
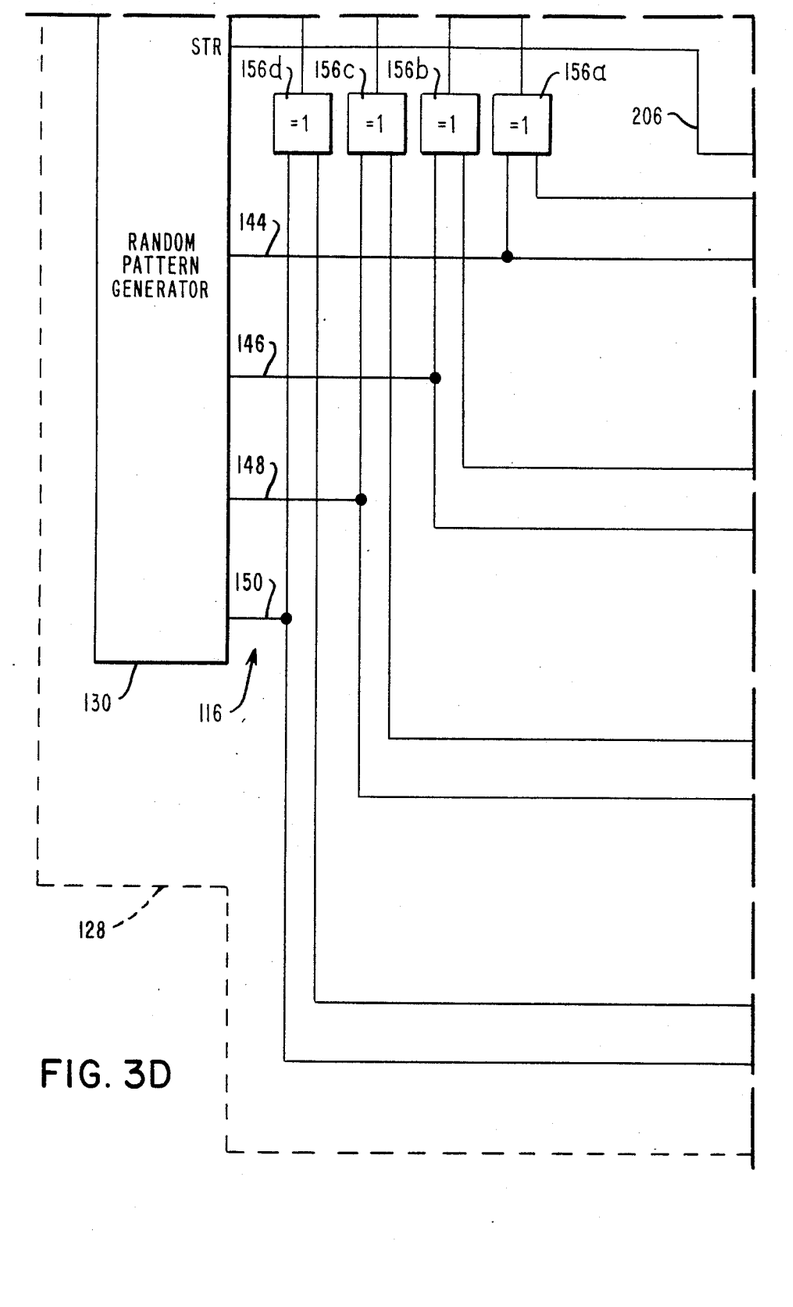
Figure 3E:
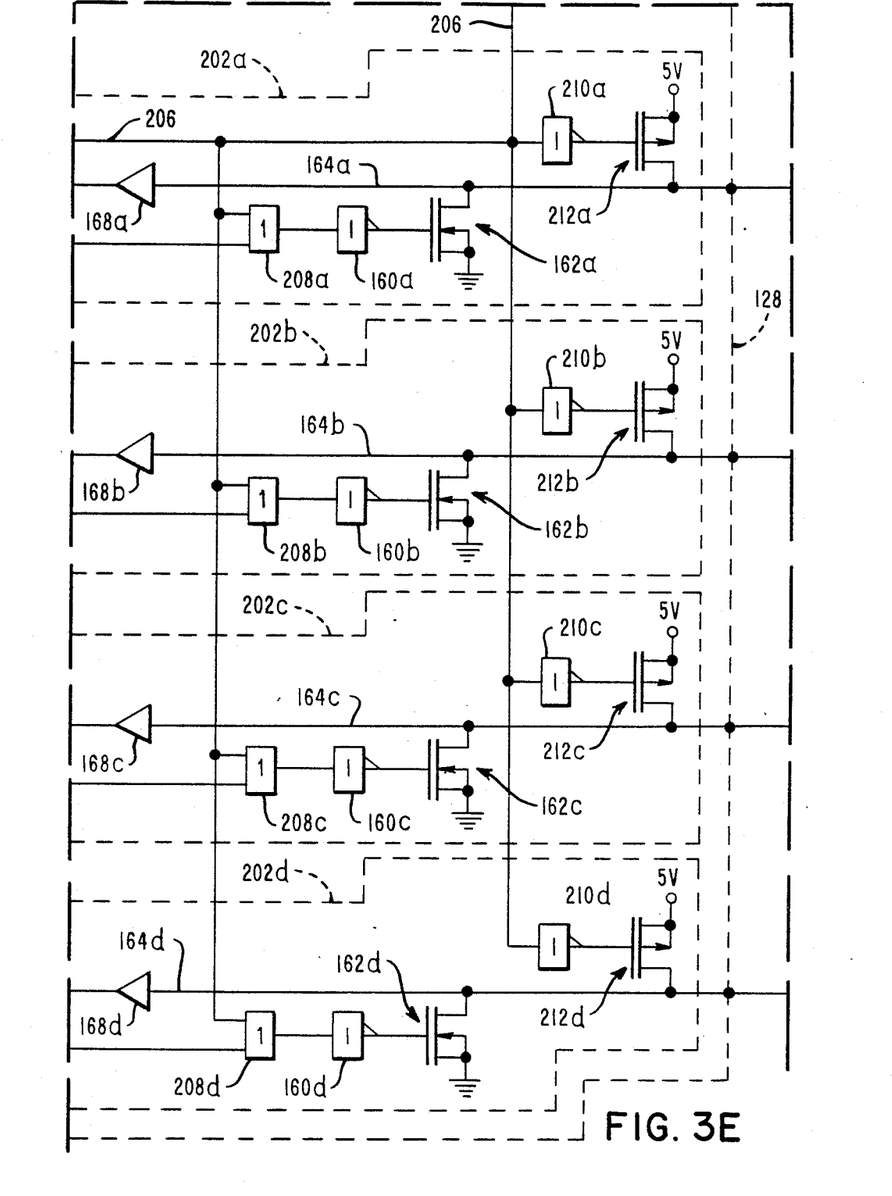
Figure 3F:
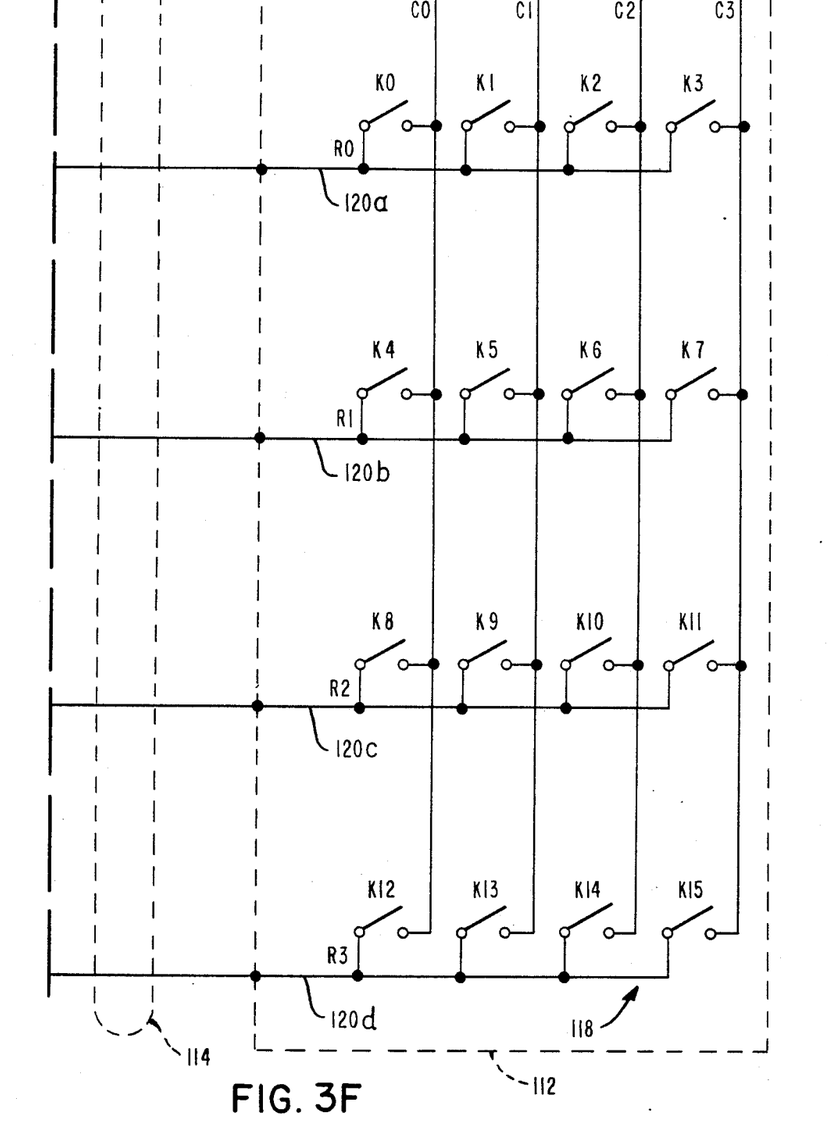

In the operation of the second embodiment, the strobe pulse on the line 206 is effective to render the transistors 162a–162d inclusive and 184a–184d inclusive non-conducting and the transistors 212a–212d inclusive and 218a–218d inclusive conducting, thereby charging the inherent capacitances of the row and column conductors 120a–120d inclusive (FIG. 3F) and 122a–122d inclusive (FIG. 3C). Following the strobe pulse, the pattern supplied by the random pattern generator 130 is effective to apply a low level logic signal to one of the column conductors 122a–122d inclusive and a random number to one of the row conductors 120a–120d inclusive, as in the first embodiment. The remaining row and column conductors, to which high logic level signals were applied during the period of the strobe pulse, will remain high for a period dependent on the capacitance values of the row and column conductors. In the preferred embodiment, this period is in the range of approximately 100 to 500 nanoseconds. During the initial portion of this period, the EXCLUSIVE-OR gates 156a–156d inclusive (FIG. 3D) and the OR gate 174 (FIG. 3A) are operative to cause the timing and control circuit 136 to provide a latch control signal over the line 190, thereby latching the binary representation of the actuated key switch in the key switch array 118 into the latch 134 which appears on the latch output bus 192.

It will be appreciated that, in the second embodiment, the current and voltage levels are the same for a simulated key activation as for a genuine key actuation, and hence a genuine key actuation cannot be distinguished from a simulated key actuation on the basis of a current or voltage level difference.

Numerous other modifications and adoptions of the apparatus of the present invention will be apparent to those skilled in the art, and thus it is intended by the appended claims to cover all such modifications and adoptions which fall within the true spirit and scope of this invention.

What is claimed is:

1. A data entry keyboard apparatus, including an array of key switches connected between row and column conductors, and associated control means connected to said row and column conductors for detecting the actuation of a key switch and providing an output signal representing an actuated key switch, characterized in that said control means includes:

random pattern generating means adapted to generate successive random patterns of first and second type binary signals;

a plurality of first port circuits coupled to said random pattern generating means and to respective ones of said row conductors;

a plurality of second port circuits coupled respectively to said column conductors;

decoding means coupled to said random pattern generating means and to said plurality of second port circuits;

and detection means coupled to said random pattern generating means and to said plurality of first port circuits, whereby each generated random pattern operates said decoding means to cause said second port circuits to provide a first type binary signal to a selected one of said column conductors and a second type binary signal to the remaining ones of said column conductors, and operates said plurality of first port circuits such that a row conductor, associated with an actuated key switch in the selected column, has a first type binary signal applied thereto and the remaining row conductors have binary signals applied thereto corresponding to the random pattern operating the decoding means, said detection means being further adapted to detect a first port circuit which has a second type binary signal applied thereto by the random pattern operating the decoding means and which is coupled to a row conductor having a first type binary signal applied thereto thereby enabling the generation of said output signal representing the actuated key switch.

2. The data entry keyboard apparatus of claim 1, in which said random pattern generating means has a plurality of first outputs connected to said decoding means and a plurality of second outputs connected respectively to said first port circuits.

3. The data entry keyboard apparatus of claim 2, in which said detection means includes a plurality of EXCLUSIVE-OR gates having inputs coupled respectively to said second outputs of said random pattern generating means and to outputs of said first port circuits.

4. The data entry keyboard apparatus of claim 3, in which said detection means further includes a latch means and an OR gate, said EXCLUSIVE-OR gates having outputs coupled to said latch means and said OR gate, said first outputs of said random pattern generating means being coupled to said latch means, and said OR gate having an output adapted to output a latching control signal effective to enable said latch means to latch the signals applied thereto.

5. The data entry keyboard apparatus of claim 4, in which each of said first port circuits includes a first field effect transistor having a gate electrode coupled via an inverter to one of said second outputs of said random pattern generating means and a source-to-drain path connected between a row port line and a reference potential, and a first resistor coupled between a supply potential and said row port line, said row port line being coupled to one of said row conductors and to one of the EXCLUSIVE-OR gates, in which each of said second port circuits includes a second field effect transistor having a gate electrode coupled via an inverter to an output of said decoding means and a source-to-drain path connected between one of said second port circuits and a reference potential, and a second resistor connected between said supply potential and said one of said second port circuits, said one of said second port circuits being coupled to one of said column conductors.

6. The data entry keyboard apparatus of claim 4, in which said row and column conductors have respective capacitive means associated therewith; in which said first port circuits and said second port circuits include respective charging means adapted to charge the associated capacitive means, and in which said random pattern generating means is adapted to provide a strobe signal effective to cause said charging means to charge said capacitive means prior to each generation of a random pattern.

7. The data entry keyboard apparatus of claim 6 in which said control means is enclosed within a tamper-resistant module.

* * * * *